United States Patent
Nishijima

[11] Patent Number: 5,904,574
[45] Date of Patent: May 18, 1999

[54] PROCESS OF MAKING SEMICONDUCTOR DEVICE AND IMPROVED SEMICONDUCTOR DEVICE

[75] Inventor: Tatsumi Nishijima, Suwa, Japan

[73] Assignee: Seiko Epson Corporation, Tokyo, Japan

[21] Appl. No.: 08/695,572

[22] Filed: Aug. 12, 1996

[30] Foreign Application Priority Data

Aug. 10, 1995 [JP] Japan .................................. 7-204544

[51] Int. Cl.⁶ .................................................. H01L 21/306
[52] U.S. Cl. ........................ 438/758; 438/758; 438/770; 438/906
[58] Field of Search .................................. 438/703, 906, 438/594, 770, 758

[56] References Cited

U.S. PATENT DOCUMENTS

| | | | |
|---|---|---|---|
| 5,229,334 | 7/1993 | Kato | 438/906 |
| 5,635,053 | 6/1997 | Aoki et al. | 205/746 |

FOREIGN PATENT DOCUMENTS

| | | | |
|---|---|---|---|
| A-63-29516 | 2/1988 | Japan . | |
| 4-92431 | 3/1992 | Japan | H01L 21/3205 |
| A-4-355921 | 12/1992 | Japan . | |

OTHER PUBLICATIONS

Stanley Wolf, Silicon Processing for the VLSI Era, vol. 1, pp. 198, 516–517, 1986.

*Primary Examiner*—Charles Bowers
*Assistant Examiner*—Thanh Nguyen
*Attorney, Agent, or Firm*—Oliff & Berridge, PLC

[57] ABSTRACT

A semiconductor device and a method for making the semiconductor device is provided. The semiconductor device has a silicon surface of a silicon substrate from which particles and metallic impurities are removed and on which a hydrophilic property is maintained to reduce contamination while the substrate is cleaned and conveyed. A first cleaning step cleans the silicon substrate by a first cleaning solution. At that time, a native oxide film is formed on the silicon surface. The silicon substrate is then rinsed by a first rinsing step using a first rinsing solution. The silicon substrate having the native oxide film is thereafter cleaned by a second cleaning solution containing hydrogen fluoride. In the second cleaning step, the surface layer of the native oxide film is removed. The silicon substrate is further subjected to a second rinsing step that rinses the silicon substrate that retains the second cleaning solution by a second rinsing solution. A time T1, in minutes, from the start of the second cleaning step to the start of the second rinsing step is:

$$T1 < 6.35 \times 10^6 \times (\text{hydrogen fluoride concentration (ppm)})^{-2.214}.$$

18 Claims, 9 Drawing Sheets

FIG. 10

PROCESS OF MAKING SEMICONDUCTOR DEVICE AND IMPROVED SEMICONDUCTOR DEVICE

BACKGROUND OF THE INVENTION

1. Field of the Invention

The present invention relates to a process of making a semiconductor device by the use of a silicon substrate or a substrate with a thin film of silicon formed thereon, and the semiconductor device.

2. Description of Related Art

When a semiconductor device is to be produced using a substrate of silicon (which will be referred to as "Si substrate") or a substrate with a thin film of silicon formed thereon (which will be referred to as "thin Si film"), the surface of the substrate is generally cleaned in each step, if necessary. For example, semiconductor devices based on the Si substrates or thin Si films include MOS type field-effect transistors (MOSFET), thin-film transistors (TFT) and so on. When such semiconductor devices are to be produced, the surfaces of the Si substrates or Si thin films to be worked are cleaned, for example, prior to formation of Si oxide films such as gate insulation films and so on.

Methods of cleaning the surfaces of the Si substrate or thin Si film may be mainly classified into four types:

(a) The first method of cleaning by the use of a first acid cleaning solution such as a hydrochloric acid-hydrogen peroxide mixture cleaning solution, or a sulfuric acid-hydrogen peroxide mixture cleaning solution, which may include hydrogen peroxide ($H_2O_2$) and hydrochloric acid (HCl), or hydrogen peroxide and sulfuric acid ($H_2SO_4$). The first acid cleaning solution will not etch the native oxide film of Si formed on the surface of the Si substrate or thin Si film.

(b) The second method of cleaning by the use of a second acid cleaning solution including hydrogen fluoride (hydrofluoric acid solution) or the like. The second acid cleaning solution will generally etch all the native oxide film on the surface of the Si substrate or thin Si film.

(c) The third method of cleaning by the use of an alkaline cleaning solution such as an ammonia-hydrogen peroxide mixture cleaning solution which may include ammonia ($NH_4OH$ or $NH_3$) and hydrogen peroxide ($H_2O_2$), or an organic alkaline solution. Such an alkaline cleaning solution will etch the native oxide film on the surface of the Si substrate or thin Si film.

(d) The fourth method of cleaning by the use of any combination of the cleaning solutions described in connection with the aforementioned methods (a) to (c).

(e) In addition, there is a cleaning method disclosed in Japanese Patent Application Laid-Open No. 4-355921, in which after the surface of the Si substrate or thin Si film has been cleaned by an ammonia-hydrogen peroxide mixture cleaning solution, the native oxide film on the top layer thereof is etched and removed by the use of a dilute hydrofluoric acid solution or a dilute hydrogen fluoride-hydrogen peroxide mixture cleaning solution which is a water solution including hydrogen peroxide ($H_2O_2$) or the like and the dilute hydrofluoric acid solution.

However, the aforementioned methods are disadvantageous in the following respects:

Method (a): Any metallic impurity contained in the cleaning solution will not be absorbed into the native oxide film formed on the surface of the Si substrate or thin Si film since the cleaning solution is acidic. However, particles on the Si substrate or thin Si film surface will be insufficiently removed since the native oxide film is not etched by the cleaning solution.

Method (b): Silicon of the surface of the Si substrate or thin Si film will be exposed since all the native oxide film is generally etched. It is therefore difficult for the Si substrate or thin Si film surface to maintain its hydrophilic property, resulting in hydrophobic property. The Si substrate or thin Si film surface therefore tends to receive particles and impurities, and the particles in the acidic cleaning solution will easily deposit on the Si substrate or thin Si film surface. To prevent the deposition of the particles, a surfactant may be added into the acid cleaning solution, which may lead to a problem of the waste solution containing the surfactant and the increased operating cost. In addition, the other metals having electronegativities higher than that of the Si material will also deposit on the Si substrate or thin Si film surface.

Method (c): The Si substrate or thin Si film surface tends to be reversely contaminated by the alkaline cleaning solution since the metallic impurities in the alkaline cleaning solution are absorbed by the native oxide film on the Si substrate or thin Si film surface and cannot be sufficiently removed from the alkaline cleaning solution. To avoid the reverse contamination, a chelating agent may be added to the alkaline cleaning solution. It is also required to treat the waste water containing the chelating agent. This also increases the operating cost.

Method (d): The Si substrate or thin Si film surface will be affected by the last used cleaning solution. Thus, the particles or metallic impurities will be insufficiently removed from the Si substrate or thin Si film surface, as in the methods (a) to (c).

Method (e): In the cleaning method disclosed in Japanese Patent Application Laid-Open No. 4-355921, the dilute hydrofluoric acid cleaning solution having a concentration, $HF:H_2O=1:200$, or the dilute hydrogen fluoride-hydrogen peroxide mixture cleaning solution having a concentration, $HF:H_2O_2:H_2O=1:1:200$, is used to etch the native oxide film to a film thickness between 0.1 nm and 0.8 nm. Considering the fact that the concentration of hydrogen fluoride in a hydrofluoric acid solution used in the semiconductor producing factories is normally 50%, the concentration of hydrogen fluoride in the dilute hydrofluoric acid or dilute hydrogen fluoride-hydrogen peroxide mixture cleaning solution is about 2500 ppm. From some experiments, the inventor confirmed that the hydrogen fluoride of such a concentration required 11.4 seconds to remove all the native oxide film on the Si substrate or thin Si film surface.

In the cleaning step of the actual semiconductor device producing process, the Si substrate or thin Si film is rinsed by the pure water and then dried after it has been cleaned by chemicals. Time required to move the Si substrate or thin Si film from a cleaning bath containing chemicals into a rinsing bath is at least between several seconds and several tens of seconds. When the cleaning solution includes hydrofluoric acid solution, the native oxide film will continue to be etched by the cleaning solution while the Si substrate or thin Si film wetted with the cleaning solution is being moved toward the rinsing bath after being removed from the cleaning bath. Thus, all the native oxide film on the Si substrate or thin Si film will be removed. As a result, the Si substrate or thin Si film surface cannot maintain its hydrophilic property.

Japanese Patent Application Laid-Open No. 63-29516 also discloses a cleaning process in which the native oxide film is left on the substrate surface. However, even if the native oxide film is left on the substrate immersed in the cleaning solution, all native oxide film will be removed by the cleaning solution while the substrate is moved into the rinsing bath after being removed from the cleaning solution for the same reason as described above. Therefore, this cannot reliably prevent the particles from being built up on the substrate. The invention of Japanese Patent Application Laid-Open No. 63-29516 cannot also prevent the metallic impurities from being taken in the substrate.

If the cleaning machine is stopped and thereafter re-started for any reason such as machine trouble while the cleaning solution is on the Si substrate or thin Si film, all the native oxide film may be removed. It is required that the hydrophilic property be maintained even if the set cleaning time is extended.

SUMMARY OF THE INVENTION

It is therefore an object of the present invention to provide a method of making a semiconductor device, which can ensure that a native oxide film is left on a substrate while the substrate is being treated by chemicals and also while the treated substrate is being moved into a rinsing bath, thereby ensuring that the hydrophilic property is maintained in the substrate surface to reduce the contamination of the substrate with heavy metals and the deposition of particles on the substrate.

Another object of the present invention is to provide a method of making a semiconductor device, which can ensure that the hydrophilic property of the substrate surface is maintained even if the cleaning machine is stopped and thereafter re-started for any reason such as a machine trouble, thereby ensuring reduction of the contamination of the substrate with heavy metals and the deposition of particles on the substrate.

Still another object of the present invention is to provide a semiconductor device improved in reliability by reducing failures due to the contamination of the substrate with heavy metals and the deposition of particles on the substrate.

The present invention provides a method of making a semiconductor device on a substrate having a silicon surface, comprising the steps of:

- a first cleaning step of cleaning the substrate with a first cleaning solution, where a native oxide film is formed on the silicon surface;
- a first rinsing step of rinsing the substrate wetted with said first cleaning solution with a first rinsing solution;
- a second cleaning step of cleaning the substrate including the native oxide film formed thereon with a second cleaning solution including hydrogen fluoride, where a surface layer is removed from the native oxide film;
- a second rinsing step of rinsing the substrate wetted with the second cleaning solution with a second rinsing solution, and
- time T1 in minutes from the start of the second cleaning step to the start of the second rinsing step being defined by the following relationship:

$$T1 < 6.35 \times 10^6 \times (\text{hydrogen fluoride concentration (ppm)})^{-2.214}.$$

According to the present invention, when the first cleaning step is carried out, the surface of the substrate is cleaned to remove particles therefrom and to form the native oxide film on the cleaned substrate surface. At that time, metallic impurities in the first cleaning solution are absorbed by the native oxide film. The second cleaning step using the second cleaning solution is thus carried out to remove the surface layer having the metallic impurities from the native oxide film and at the same time to remove the particles from the native oxide film. If the native oxide film is left on the substrate while the second cleaning step is being performed and also until the substrate is immersed into the second rinsing solution, the hydrophilic property in the substrate surface can be maintained to prevent the metallic impurities and particles from being built up on the substrate.

The right term in the above inequality in the present invention is an empirical formula determined by the inventor through experiments. This empirical formula shows the time T1 in minutes required from the start of the second cleaning step until all the native oxide film has been removed from the substrate. In other words, this empirical formula indicates the time T1 in minutes required until the substrate exhibits the hydrophobic property after the second cleaning step has been started. Such a time will be called "hydrophilic property keeping time T". More particularly, the above empirical formula shows the minimum cleaning time required when the substrate continues to be immersed in the second cleaning solution until all the native oxide film has been removed from the substrate by the second cleaning solution.

On the other hand, in the actual semiconductor production line, the substrate is removed from the second cleaning solution after the substrate has been immersed in the second cleaning solution for a given cleaning time. The substrate is then fed to the next or second rinsing step. During this movement, the native oxide film is being removed from the substrate since the substrate is wetted with the second cleaning solution. Note that when the substrate is in the second cleaning solution, the native oxide film is supposed to be removed faster than that when the substrate is being transferred because more hydrogen fluoride affects the substrate when the substrate is in the second cleaning solution.

Since the substrate should be transferred in the actual semiconductor device producing process, the time from the start of cleaning by the second cleaning solution until the substrate shows the hydrophobic property during the transference is longer than the hydrophilic property keeping time T. Therefore, the hydrophilic property keeping time T defined by the above empirical formula includes a margin.

Therefore, the native oxide film is ensured to be left on the substrate while the substrate is being immersed in the second cleaning solution and also while the substrate is being moved to the second rinsing step. Once the substrate is immersed in the second rinsing solution, the second cleaning solution will be washed out from the substrate, thereby stopping the removal of the native oxide film therefrom.

Since the native oxide film is ensured to exist on the substrate when it is being immersed in the second cleaning solution, the hydrophilic property of the substrate surface can be maintained. According to the present invention, therefore, the substrate can be prevented from being contaminated by the particles and metallic impurities from the second cleaning solution, for example, even when the substrate surface immersed in the second cleaning solution exhibits the hydrophobic property.

According to the present invention, furthermore, the hydrophilic property in the substrate surface can be maintained by the fact that the native oxide film is ensured to be left on the substrate even when the substrate is being moved to the second rinsing step after subjected to the second cleaning step. Therefore, the method of the present invention can avoid a particle contamination from particles that are deposited from air onto the substrate surface. The particles, that are deposited from air, cannot be removed even by the second rinsing step, as in a case where the surface of the substrate being moved exhibits the hydrophobic property. According to the present invention, moreover, the native oxide film is ensured to be left on the substrate even during the second rinsing step, thereby maintaining the hydrophilic property on the substrate can be ore, the substrate can be prevented from being contaminated by the particles deposited on the substrate surface from the second rinsing solution, for example, when the substrate surface exhibits the hydrophobic property prior to start of the second rinsing step.

It is preferred that the concentration of hydrogen fluoride in the second cleaning solution is between about 60 ppm and about 2000 ppm. In other words, the hydrophilic property keeping time T required by the aforementioned empirical formula is preferably ensured to be longer by reducing the concentration of the hydrogen fluoride to a level lower than the prior art.

If the concentration of the hydrogen fluoride is equal to about 2000 ppm, the hydrophilic property keeping time T determined by the aforementioned empirical formula becomes equal to about 0.13 minutes or about 18.7 seconds. If the aforementioned time T1 is set to be shorter than the hydrophilic property keeping time T, the substrate can be prevented from being contaminated by the heavy metals and particles. The lower limit of the hydrogen fluoride concentration, about 60 ppm, is necessarily required to remove the surface layer of the native oxide film in the second cleaning step for a practical cleaning time.

The present invention preferably defines the following relationship:

$$T2 + T3 + T4 < 6.35 \times 10^6 \times (\text{hydrogen fluoride concentration(ppm)})^{-2.214}$$

where T2 is a cleaning time in the second cleaning step; T3 is a conveyance time required to move the substrate to the second rinsing step whereat the substrate is immersed in the second rinsing solution, after the substrate has been cleaned in the second cleaning step; and T4 is a margin time. T2, T3 and T4 are in minutes.

Thus, the hydrophilic property in the substrate surface can be maintained even when the operation of the cleaning machine is stopped due to any trouble within the range of the margin time T4 or even though the cleaning time T2 and substrate moving time T3 are extended.

It is further preferred that the method of the present invention further comprises a step of determining the cleaning time T2, substrate moving time T3 and margin time T4 under a condition meeting the aforementioned inequality.

Since time whereat the substrate surface exhibits the hydrophobic property can be clearly determined by calculating the right term in the aforementioned inequality, these times T2, T3 and T4 can be easily set, unlike the prior art wherein they would be determined only through experiences.

It is further preferred that the concentration of hydrogen fluoride in the second cleaning solution is between about 100 ppm and about 1200 ppm.

If the hydrogen fluoride concentration is equal to about 1200 ppm, the hydrophilic property keeping time T determined by the aforementioned empirical formula becomes equal to about 0.97 minutes or about 58 seconds. If the aforementioned time T1 is set to be shorter than the hydrophilic property keeping time T, the substrate can be prevented from being contaminated by the heavy metals and particles. The lower limit of the hydrogen fluoride concentration, about 100 ppm, is required to remove effectively the surface layer of the native oxide film in the second cleaning step for a practical cleaning time.

It is further preferred that the concentration of hydrogen fluoride in the second cleaning solution is between about 100 ppm and about 300 ppm.

If the hydrogen fluoride concentration is equal to about 300 ppm, the hydrophilic property keeping time T determined by the aforementioned empirical formula becomes equal to about 20.8 minutes. If the aforementioned time T1 is set to be shorter than the hydrophilic property keeping time T, therefore, the substrate can be prevented from being contaminated by the heavy metals and particles.

If the hydrogen fluoride concentration in the second cleaning solution is between about 100 ppm and about 300 ppm and when the processing time including the margin time, or the sum of T2, T3 and T4, is between about 1 minute and about 20 minutes, the aforementioned inequality is held and the processing time can be set to a practical value. Since the upper limit is about 20 minutes, particularly, the margin time T4 enough for any troubles can be secured. When the processing time is set to about 1 minute, which is the lower limit, to increase a through-put, it is possible to transfer the substrate from the second cleaning step to the second rinsing step using conventional carrying equipment, while keeping a cleaning time at the second cleaning step whereat enough cleaning effect is assured. Also, it is not necessary to speed the transference of the substrate.

In the present invention, the second cleaning solution can include one of hydrogen peroxide and ozone. Si can be oxidized to form a further native oxide film on the native oxide film/Si interface by the hydrogen peroxide in the second cleaning solution. The ozone also can form a further native oxide film on the native oxide film/Si interface. Therefore, the time in which the hydrophilic property of the substrate is maintained increases much more. In the case of using ozone, a cleaner native oxide film can be formed in the second cleaning step because ozone has lower concentration of metallic impurities than hydrogen peroxide.

It is further preferred that the first cleaning solution contains one of hydrogen peroxide and ozone. Thus, a native oxide film can be reliably formed on the silicon in the first cleaning step.

It is further preferred that the native oxide film left on the substrate at the start of the second rinsing step has a film thickness equal to or less than about 1 nm. Such a film thickness does not raise a problem on controlling the film thickness of an oxide film formed in the subsequent step.

It is further preferred that the method of the present invention further comprises the steps of drying the substrate after termination of the second rinsing step and forming an oxide film on the substrate on which the native oxide film is left.

It has been found from experimentation that the concentration of iron on the substrate after the drying step could be in the order of $10^{10}$(atoms/cm$^2$) or less in accordance with the method of the present invention. It has also been found from experimentation that the concentration of aluminum in metal impurities on the substrate after the drying step could be in the order of $10^{11}$(atoms/cm$^2$).

Since the method of the present invention can thermally oxidize the clean native oxide film containing less metallic impurities to form an oxide film, various electrical characteristics in the semiconductor device, such as long-term reliability in the oxide film, initial pressure resistance and so on can be improved.

In the oxide film forming step of the present invention, any of various films such as the gate oxide film of a transistor, the capacitor oxide film of a memory element, the tunnel oxide film of a floating gate type nonvolatile memory and so on can be formed on the substrate.

In the semiconductor device produced according to the method of the present invention, the interface between the oxide film and the silicon and the surface of the oxide film provides a clean surface containing less metallic impurities and particles. In addition, since less metallic impurities are contained in the oxide film, various electrical characteristics in the semiconductor device, such as long-term reliability in the oxide film, initial pressure resistance and so on can be improved, as described.

BRIEF DESCRIPTION OF THE DRAWINGS

The above and further objects and advantages of the present invention will become clearer from the following description of preferred embodiments taken in conjunction with the following drawings, in which like reference numerals refer to like elements, and wherein.

DETAILED DESCRIPTION OF THE PREFERRED EMBODIMENTS

While this invention is described in detail herein, with specific reference to certain illustrated embodiments, it is to be understood that there is no intent to be limited to those embodiments. On the contrary, the aim is to cover all modifications, alternatives and equivalents falling within the spirit and scope of the invention.

The present invention will now be described in detail by way of example with reference to the drawings.

Figure 1:
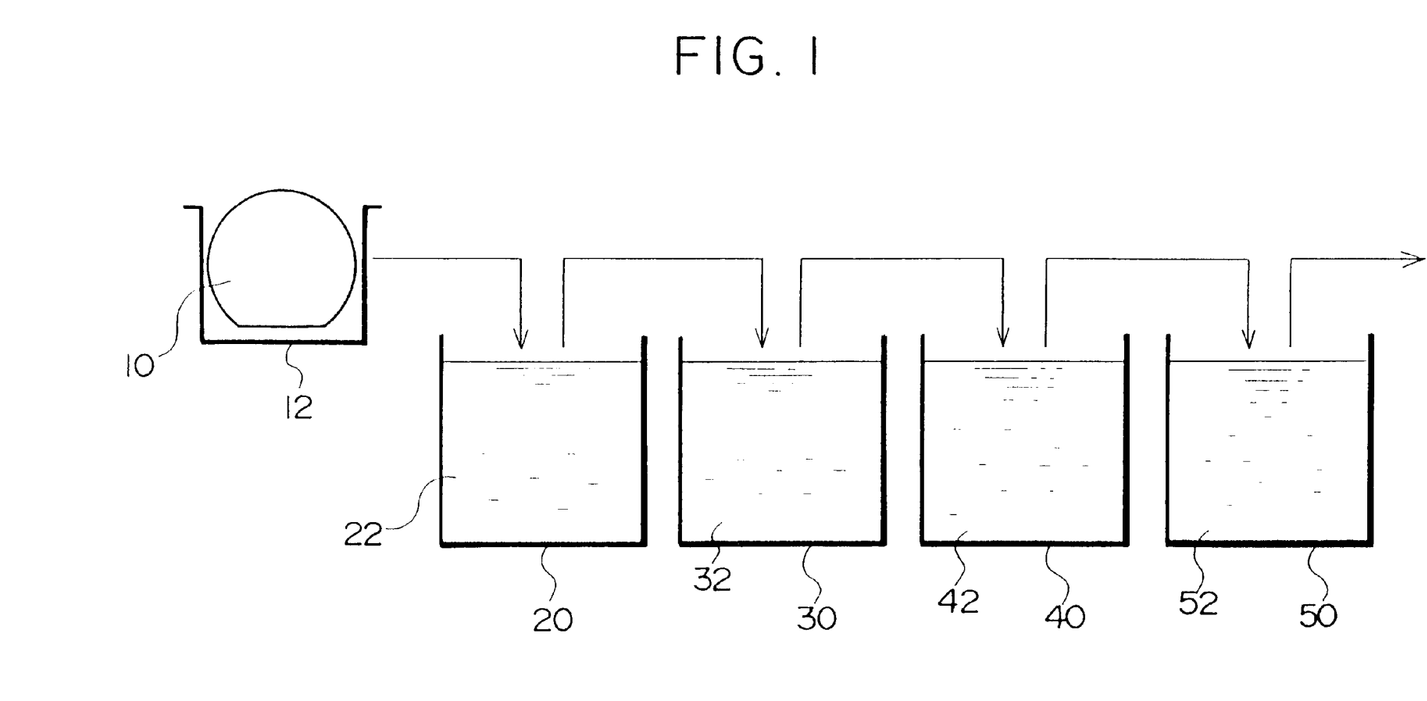
FIG. 1 is a schematic view illustrating cleaning and rinsing steps in the method of the present invention.

FIG. 1 is a schematic view illustrating steps of cleaning and rinsing a silicon substrate 10 from which a semiconductor device is to be formed. A plurality of such silicon substrates 10, for example, 25 substrates, are received in a corrosion-resistant carrier 12. Such a carrier 12 is subjected to the cleaning and rinsing steps in batch. Such a batch treatment may be replaced by a successive treatment in which the silicon substrates 10 are cleaned and rinsed one at a time.

The process of treating the silicon substrates 10 generally comprises a first cleaning step, a first rinsing step, a second cleaning step and a second rinsing step.

FIRST CLEANING STEP

As shown in FIG. 1, the first cleaning step is carried out by immersing a plurality of the silicon substrates 10 on the carrier 12 into a first cleaning bath 20 which contains a first cleaning solution 22 including hydrogen peroxide. For example, the first cleaning solution 22 can be an ammonia-hydrogen peroxide mixture cleaning solution (e.g., $NH_4OH:H_2O_2:H_2O=1:1:5$). This operation is performed by holding the carrier 12 by a first handling mechanism (not shown) and lowering the first handling mechanism to immerse the carrier 12 and the silicon substrates 10 in the carrier 12 into the first cleaning solution 22.

Figure 2A:
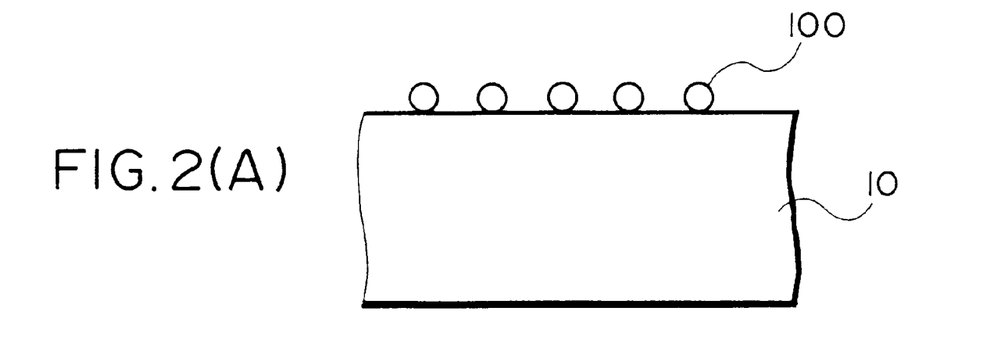
FIGS. 2A–2C are schematic views illustrating a process of removing particles and metallic impurities in the cleaning step of the present invention.
Figure 2B:
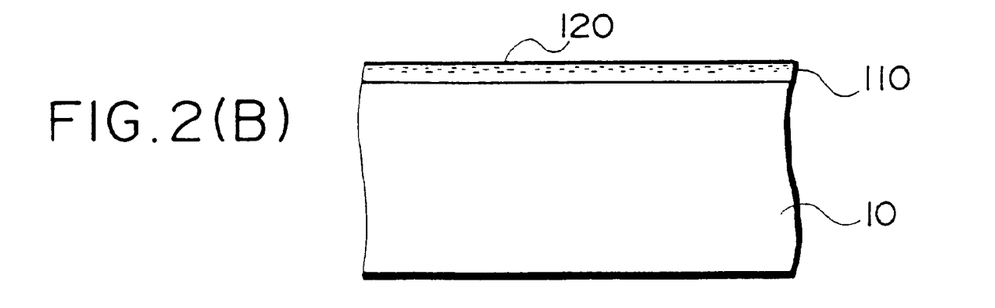

As shown in FIG. 2A, the first cleaning step is carried out to remove particles 100 built up on the silicon substrates 10 under the action of the first cleaning solution 22. At that time, the first cleaning solution 22 functions to form a native oxide film 110 having its film thickness equal to about 1 nm on the surface of each of the silicon substrates 10, as shown in FIG. 2B. The native oxide film 110 contains metallic impurities 120 transferred from the first cleaning solution 22 to the surface of the native oxide film 110.

The first cleaning solution 22 used in the first cleaning step may contain ozone in place of the hydrogen peroxide for similar cleaning action.

FIRST RINSING STEP

The first handling mechanism used in the first cleaning step delivers the carrier 12 to a second handling mechanism directly or through a conveying member. The second handling mechanism then immerses the carrier 12 and the silicon substrates 10 received therein in a first rinsing solution 32 (e.g., pure water) within a first rinsing bath 30 shown in FIG. 1.

The first rinsing step washes out the first cleaning solution 22 from the silicon substrates 10 and carrier 12. This can prevent a so-called cross-contamination in which the first cleaning solution 22 is mixed into a second cleaning solution 42 used in the second cleaning step.

SECOND CLEANING STEP

The second handling mechanism used in the first rinsing step delivers the carrier 12 to a third handling mechanism directly or through a conveying member. The third handling mechanism then immerses the carrier 12 and the silicon substrates 10 received therein in the second cleaning solution 42 within a second cleaning bath 40 shown in FIG. 1.

The second cleaning solution 42 may include a dilute hydrogen fluoride-hydrogen peroxide mixture cleaning solution containing hydrogen fluoride and hydrogen peroxide or another cleaning solution containing ozone in place of hydrogen peroxide.

Figure 2C:
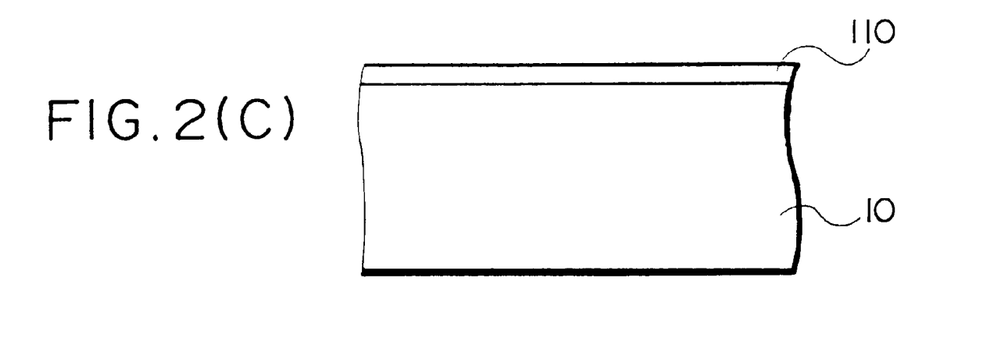

The second cleaning step removes the surface layer of the native oxide film 110 on each of the silicon substrates 10 to the extent from about 0.1 nm to about 0.3 nm, for example, which contains the metallic impurities 120, as shown in FIG. 2C. At the same time, particles are also removed from the silicon substrates 10. Thus, a further native oxide film is formed on the interface between the native oxide film 110 and the silicon substrate 10 under the action of hydrogen peroxide or ozone in the second cleaning solution 42.

SECOND RINSING STEP

The third handling mechanism used in the second cleaning step then delivers the carrier 12 to a fourth handling mechanism directly or through a conveying member. The fourth handling mechanism immerses the carrier 12 and the silicon substrates 10 received therein in a second rinsing solution 52 (e.g., pure water) within a second rinsing bath 50 shown in FIG. 1.

The second rinsing step washes out the second cleaning solution 42 on the silicon substrates 10 and carrier 12. At this point, the second cleaning solution 42 is removed from the silicon substrates 10 until the specific resistance of the pure water becomes equal to or higher than about 10 MΩ·cm. Thus, the silicon substrates 10 can be treated in the subsequent step under such a condition that the second cleaning solution 42 is not on the silicon substrates 10. In connection with such an arrangement, all of the first-fourth handling mechanisms may be replaced by a single handling mechanism.

The other technical meaning of the second rinsing step resides in that the removal of the native oxide film 110 from the silicon substrates 10 through the second cleaning solution 42 thereon is halted at the start of the second rinsing step. More particularly, the native oxide film 110 is continuously removed from the silicon substrates 10 by the second cleaning solution 42 thereon while the silicon substrates 10 are moved from the second cleaning bath 40 to the second rinsing bath 50 after termination of the second cleaning step. If such a state is left as it is, all the native oxide film 110 will finally be removed from the silicon substrates 10 to provide the hydrophobic property to the surfaces of the silicon substrates 10. Since the silicon substrates 10 exhibit the hydrophilic property as long as the native oxide film 110 is left thereon, particles and metallic impurities will be less built up on the surfaces of the silicon substrates 10. Once the silicon substrates 10 acquire the hydrophobic property, the particles and metallic impurities tend to be built up on the surfaces of the silicon substrates 10, leading to failure.

In this embodiment, therefore, it is important that the native oxide film 110 is left on the silicon substrates 10 at the start of the second rinsing step.

HYDROPHILIC PROPERTY KEEPING TIME T

The inventors confirmed the time when the silicon substrates 10 exhibit the hydrophobic property through experiments. In such experiments, the second cleaning solution 42 was a dilute hydrogen fluoride-hydrogen peroxide mixture cleaning solution at a room temperature (25° C.). As the concentration of the hydrogen fluoride was varied, times when each of the silicon substrates 10 with a native oxide film 110 thickness equal to about 1 nm exhibited the hydrophobic property were measured. The measurements are shown in FIG. 3.

Figure 3:
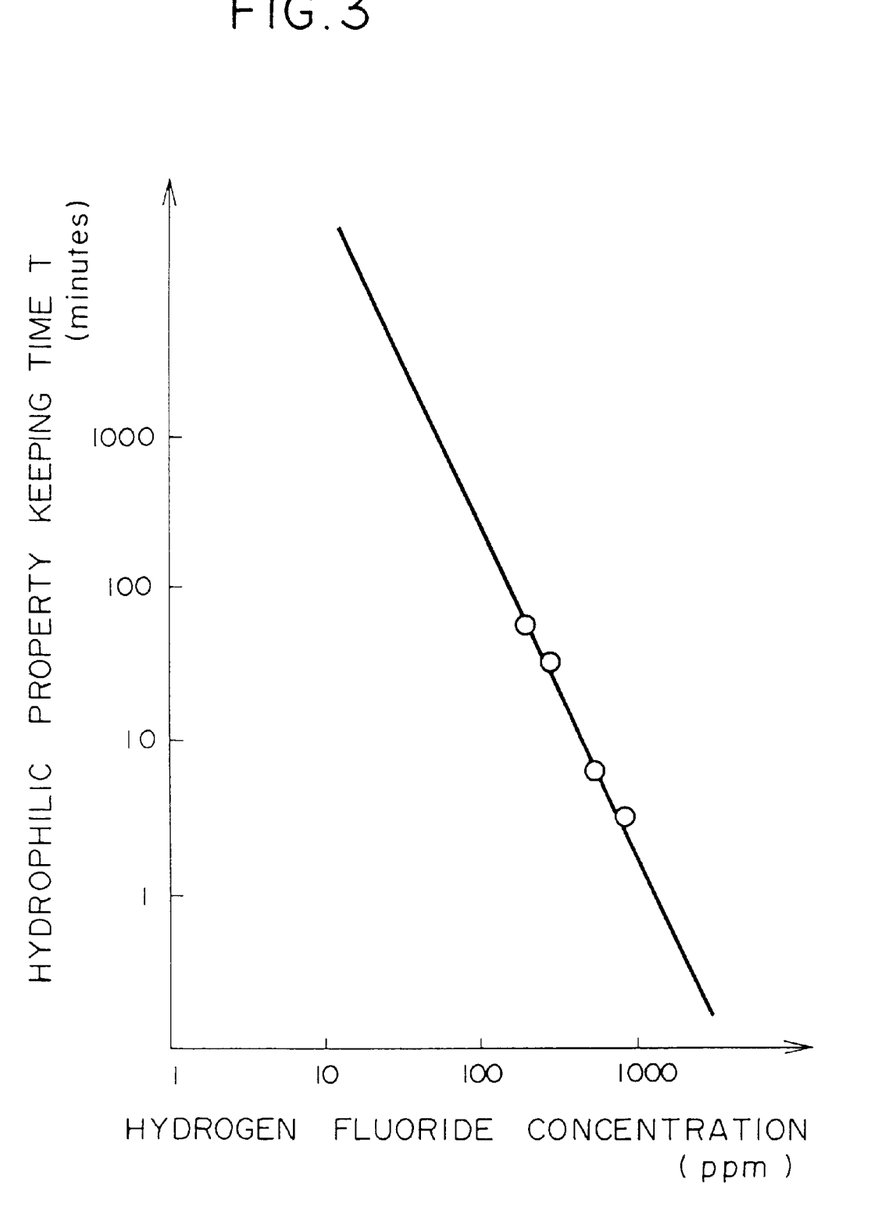
FIG. 3 is a graph illustrating the relationship between the hydrogen fluoride concentration and the hydrophilic property keeping time, which is determined from experiments.

The horizontal axis in FIG. 3 indicates the hydrogen fluoride concentration (ppm) in logarithmic scale while the vertical axis in the same figure indicates the time (hydrophilic property keeping time T) from the start of the second cleaning step until the surface of the silicon substrates 10 exhibit the hydrophobic property in logarithmic scale. By visually inspecting the wetted degree of the surface of the silicon substrates 10 when removed from the second cleaning solution 42, it was judged whether or not the surface of the silicon substrates 10 exhibited the hydrophobic property.

As shown in FIG. 3, the hydrophilic property keeping time T decreases as the concentration of the hydrogen fluoride increases or vice versa. It was particularly found from FIG. 3 that the hydrophilic property keeping time T in minutes could be defined by the following formula as a function of the hydrogen fluoride concentration (ppm):

$$\text{Hydrophilic property keeping time in minutes} = \qquad (1)$$
$$6.35 \times 10^6 \times (\text{hydrogen fluoride concentration (ppm)})^{-2.214}.$$

The experiments determined the hydrophilic property keeping time under such a condition that the silicon substrates 10 were continuously immersed in the second cleaning solution 42. In other words, the minimum time until the silicon substrates 10 exhibited the hydrophobic property after all the native oxide film 110 had been removed therefrom was determined as the hydrophilic property keeping time T.

However, after immersion in the second cleaning solution 42 for a predetermined time, the silicon substrates 10 are pulled out of the second cleaning solution 42 to be transferred for the second rinsing step, and actually the native oxide film 110 continues to be removed only by the second cleaning solution 42 remaining on the silicon substrates 10. In other words, the native oxide film 110 is supposed to be removed more slowly during the transference of the silicon substrates 10 because the hydrogen fluoride which affects the silicon substrates 10 is reduced. Therefore, it is expected that the hydrophilic property keeping time obtained by the actual produced device is longer than the above experiments.

Therefore, the above formula (1) can be understood to indicate the minimum hydrophilic property keeping time T when the second cleaning solution 42 having some concentration of hydrogen fluoride is used. It can be thus understood that it is useful to use the hydrophilic property keeping time T defined by this formula (1) for introducing a condition required to maintain the hydrophilic property in the silicon substrate 10.

Although the aforementioned experiments used hydrogen peroxide solution having a concentration of about 5%, the same results were provided when the concentration was varied between about 0.5% and about 30%.

CONDITIONS FOR MAINTAINING HYDROPHILIC PROPERTY OF SILICON SUBSTRATE

As described above, the hydrophilic property can be maintained on the surface of the silicon substrates 10 from the second cleaning step until the second rinsing step is terminated if the second rinsing step is carried out for the silicon substrates 10 on which the native oxide film 110 is left. In other words, particles and metallic impurities can be less built up on the surface of the silicon substrates 10 after the second cleaning step has been terminated and until the second rinsing step is terminated.

For such a purpose, it is preferred that time T1 from the start of the second cleaning step when removal of the native oxide film 110 begins until the silicon substrates 10 are subjected to the second rinsing step is shorter than the hydrophilic property keeping time T shown in FIG. 3.

In other words, if T1<T, the silicon substrates 10 can be treated by the second rinsing step under the condition wherein the native oxide film 110 is left on the surface of the silicon substrates 10.

The time T1 is a sum of the cleaning time T2 during which the second cleaning step is carried out and the conveyance time T3 during which the silicon substrate 10 is being moved from the second cleaning step to the second rinsing step. The time T1 may be represented by:

$$T1 = T2 + T3 < T.$$

More preferably, a desired margin time may be set for any accident, for example, for a case when the movement of the silicon substrates 10 is halted due to any trouble occurring in the actual production line. If it is assumed that a margin time from the halt of the cleaning device until the cleaning device is restored into its operable state is T4, it is preferable that:

$$T1=T2+T3<T2+T3+T4<T.$$

Thus, the hydrophilic property can be maintained on the silicon substrates 10 being moved even if the cleaning machine is halted due to any trouble and thereafter restored.

HYDROGEN FLUORIDE CONCENTRATION AND MARGIN TIME

Figure 4:
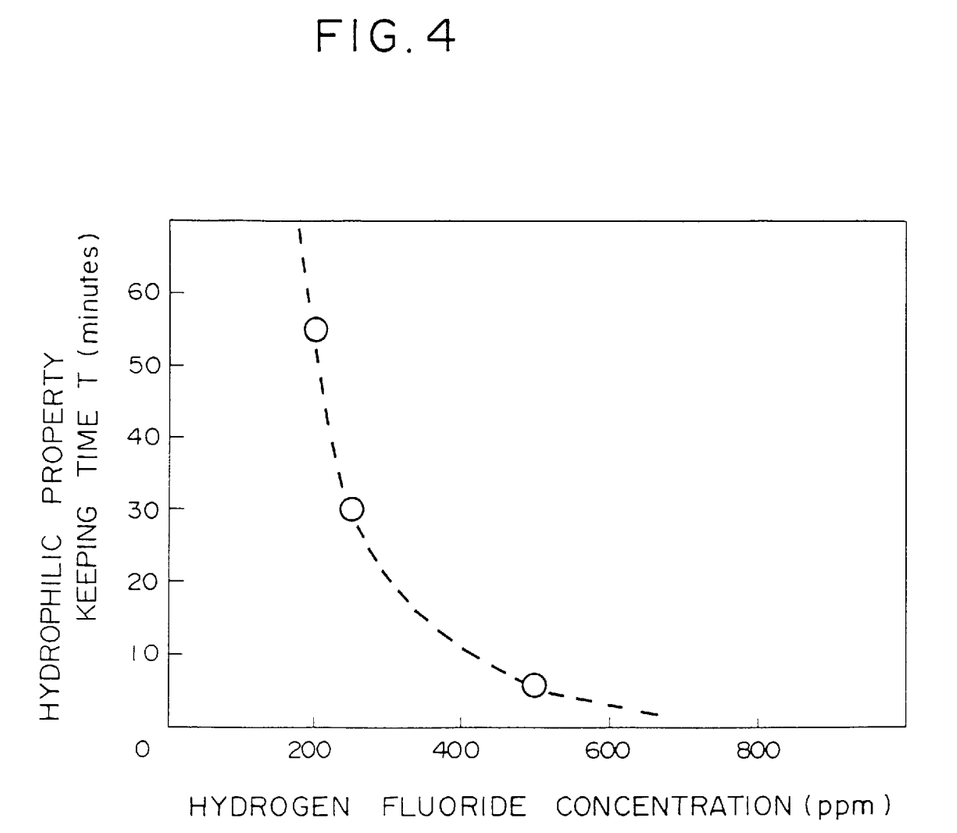
FIG. 4 is a graph illustrating a part of the relationship between the hydrogen fluoride concentration and the hydrophilic property keeping time in FIG. 3.

FIG. 4 is a graph illustrating hydrophilic property keeping times when the hydrogen fluoride concentration shown in FIG. 3 is about 200 ppm, about 250 ppm and about 500 ppm.

In such experiments, it was found that the hydrophilic property keeping time T is about six minutes at about 500 ppm; about 30 minutes at about 250 ppm; and about 55 minutes at about 200 ppm. If the concentration of hydrogen fluoride is about 300 ppm, it is found from the above formula (1) and FIG. 4 that the hydrophilic property keeping time T is about 21 minutes.

It is thus found that the hydrophilic property keeping time T can be secured to be equal to or longer than about 20 minutes if the concentration of hydrogen fluoride is equal to or less than about 300 ppm.

In the actual production, the time T1 of about 20 minutes is sufficient. In many cases, the time T1 may be set to be equal to or shorter than about 15 minutes. As described, the data in the above formula (1) and FIG. 4 indicates the minimum hydrophilic property keeping time T. In the actual production, time until the hydrophobic property is exhibited is necessarily longer than the hydrophilic property keeping time T=about 20.8 minutes which is determined by the above empirical formula (1) at the hydrogen fluoride concentration of about 300 ppm. Considering these matters, it is to be understood that if the hydrogen fluoride concentration is set to be equal to or less than about 300 ppm and when the sum time T1 of the cleaning time T2 and the conveyance time T3 is set to be between about 1 minute and about 20 minutes, the hydrophilic property can be maintained on the silicon substrates 10 while securing a sufficient margin time T4. Particularly, if the time T1 is set to be equal to or shorter than about 15 minutes and when the hydrogen fluoride concentration is set to be equal to or less than about 300 ppm, the margin time T4 can be necessarily secured to be equal to or longer than about 5 minutes. This can provide a practical margin time T4 in the actual production. It is further preferable that the margin time T4 is set to be equal to or longer than about 10 minutes.

HYDROGEN FLUORIDE CONCENTRATION FOR SECURING DESIRED MARGIN TIME T4

If the second cleaning solution having a given hydrogen fluoride concentration is used and when that hydrogen fluoride concentration is substituted in the above formula (1), an hydrophilic property keeping time T can be determined. In such a case, the following inequality $$T2+T3+T4<T$$

must be satisfied, where T2 is the cleaning time in the second cleaning step; T3 is the conveyance time required to move the silicon substrates 10 after they have been subjected to the second cleaning step and until the second rinsing step is started; and T4 is the margin time.

Thus, the margin time T4 can be determined depending on the cleaning and conveyance times T2, T3.

If the hydrogen fluoride concentration is about 2000 ppm, the hydrophilic property keeping time T is about 18.7 seconds from the above formula (1). If each of the cleaning and conveyance times T2 and T3 is several seconds, then the margin time T4 can be secured to be several seconds. Thus, the hydrophilic property can be maintained on the silicon substrates 10. On the other hand, Japanese Patent Application Laid-Open No. 4-355921 uses the hydrogen fluoride concentration of 2500 ppm. If such a hydrogen fluoride concentration is used to determine the hydrophilic property keeping time T from the above formula (1), the hydrophilic property keeping time T becomes equal to about 11.4 seconds. This can never maintain the hydrophilic property on the silicon substrate in the actual production.

In this embodiment, therefore, the upper limit of the hydrogen fluoride concentration is set to be about 2000 ppm. The hydrophilic property keeping time T preferably increases as the hydrogen fluoride concentration decreases. Therefore, the lower limit of the hydrogen fluoride concentration is preferably equal to or higher than about 60 ppm when the cleaning effect in the second cleaning step is considered.

When the hydrophilic property keeping time T is determined from the above empirical formula (1) to equal about 1 minute, the hydrogen fluoride concentration becomes equal to about 1200 ppm. To ensure that the cleaning effect in the second cleaning step is more practical, it is preferred that the hydrogen fluoride concentration is equal to or higher than about 100 ppm.

Consequently, the preferred hydrogen fluoride concentration in this embodiment is equal to or less than about 2000 ppm from the viewpoint of the possible margin time T4 and equal to or higher than about 60 ppm from the viewpoint of the more effective cleaning effect in the second cleaning step. Furthermore, the hydrogen fluoride concentration is preferably between about 100 ppm and about 1200 ppm and more preferably between about 100 ppm and about 300 ppm in order that the margin time T4 will be surely secured in the actual production and that the cleaning time T2 will be reduced to improve the throughput.

SEMICONDUCTOR PRODUCTION PROCESS TO WHICH PRESENT INVENTION IS APPLIED

The cleaning process according to this embodiment is particularly preferably carried out prior to formation of a thin oxide film which requires an insulation pressure resistance and so on.

(1) Field effect transistor (FET) production process

Figure 5A:
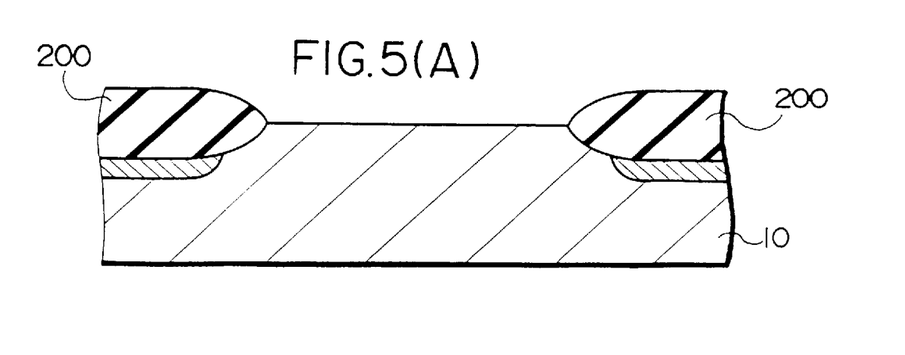
FIGS. 5A–5D are schematic views illustrating a part of a MOSFET producing process.

FIGS. 5A–5D show a part of a MOSFET production process. FIG. 5A is a sectional view illustrating an element separation step in which local oxidation of silicon (LOCOS) is formed on a silicon substrate 10. Under such a state, silicon is exposed between two LOCOS portions 200.

The aforementioned first cleaning step, first rinsing step, second cleaning step, second rinsing step and drying step are carried out after the element separation step of FIG. 5A.

Figure 5B:
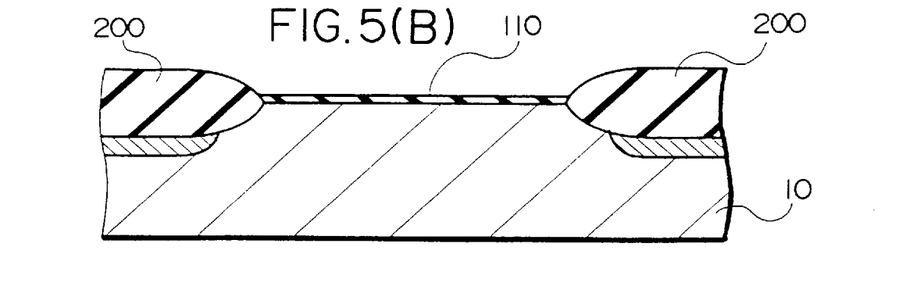

As a result, a native oxide film 110 containing less metallic impurities and having a thickness equal to or less than about 1 nm is formed on the surface of the silicon substrate 10 between the two LOCOS portions 200, as shown in FIG. 5B.

Figure 5C:
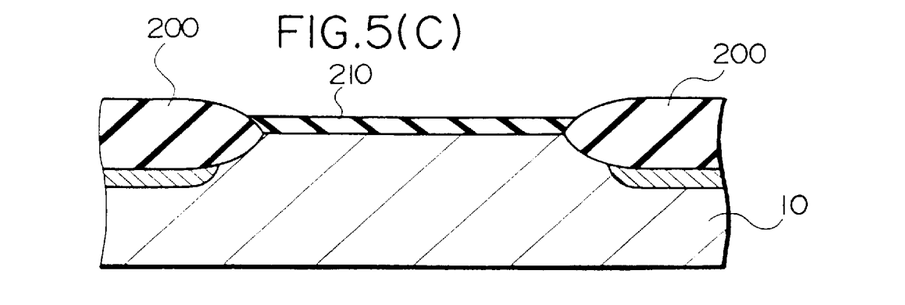

Thereafter, the silicon substrate 10 is thermally oxidized together with the native oxide film 110 to form a gate oxide film 210, as shown in FIG. 5C. The film thickness of the gate oxide film 210 depends on the design rule. In this embodiment, the film thickness is between about 8 nm and about 15 nm. Note that the gate oxide film 210 may be formed by carrying out wet oxidization of the substrate in steam for about 30 minutes under the processing temperature of about 900° C., for example.

Figure 5D:
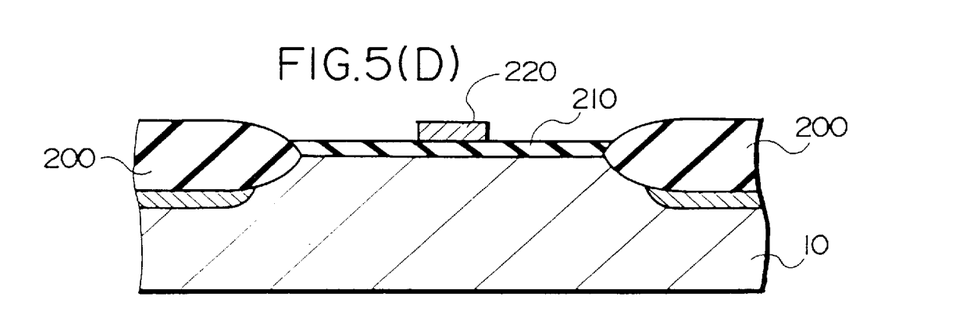

An electrode 220 of polysilicon, for example, is further formed, as shown in FIG. 5D.

(2) Dynamic random access memory (DRAM) production process

When DRAM is to be produced, it is required that a capacitor oxide film is formed as a thin film. It is preferred that the above cleaning process is carried out before the capacitor oxide film is formed.

(3) Floating gate type nonvolatile memory production process

Figure 6:
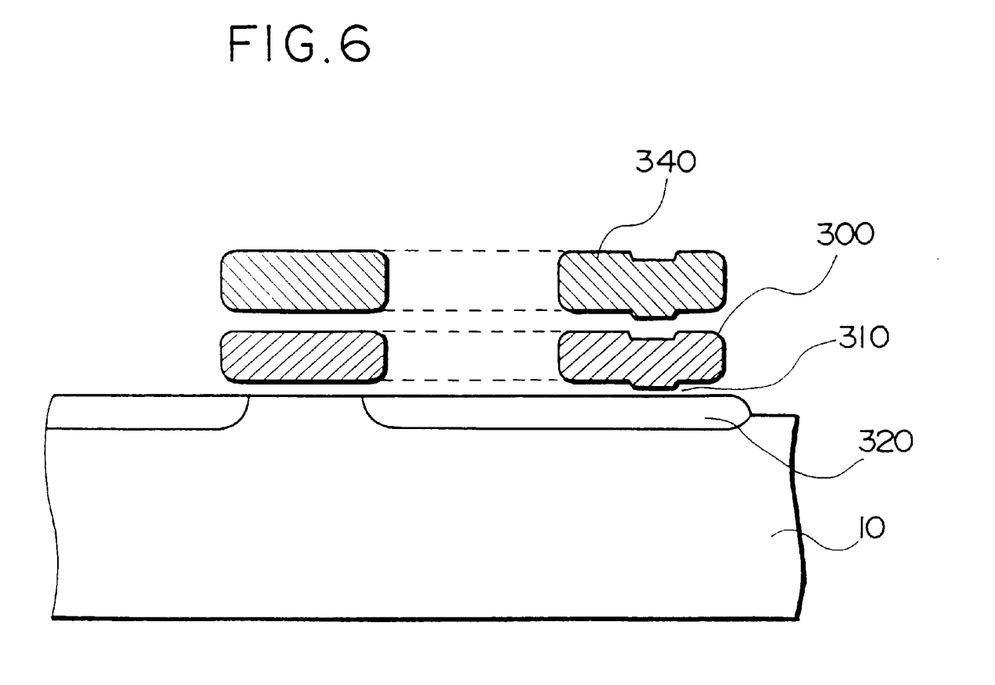
FIG. 6 is a schematic view illustrating a floating gate type nonvolatile memory.

For example, a floating gate type EEPROM includes a very thin tunnel oxide film 310 which is formed below part of a floating gate 300, as schematically shown in FIG. 6. Carriers come and go between the floating gate 300 and a drain region 320 through this tunnel oxide film 310. Data are written or erased by the use of a tunnel current which flows through the tunnel oxide film 310 depending on a voltage applied to a control gate 340.

In addition, such a tunnel oxide film may be used in a nonvolatile RAM provided by a combination of the above floating gate type EEPROM with SRAM.

FIGS. 7A–7D show a part of a process of producing a floating gate type nonvolatile memory. These figures are sectional views as viewed from the right side of FIG. 6.

Figure 7A:
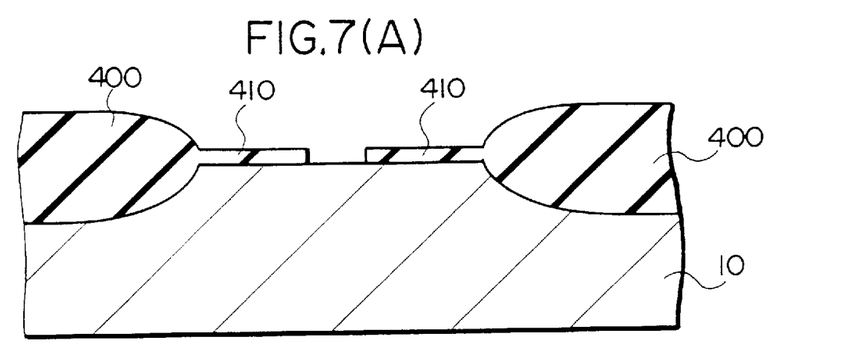
FIGS. 7A–7D are schematic views illustrating a part of the process of producing the floating gate type nonvolatile memory shown in FIG. 6.

FIG. 7A is a sectional view illustrating an element separation accomplished by forming LOCOS portions 400 on a silicon substrate 10. Under such a state, part of a thermal oxide film 410 left between the two LOCOS portions 400 is etched off after the element separation.

The aforementioned first cleaning step, first rinsing step, second cleaning step, second rinsing step and drying step are carried out after the element separation and etching steps of FIG. 7A.

Figure 7B:
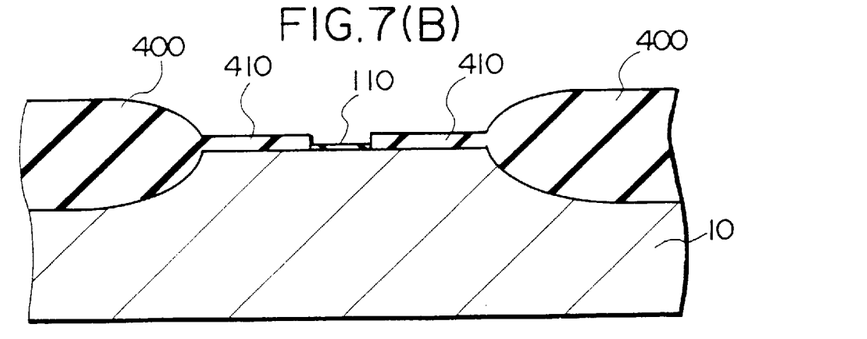

As a result, a native oxide film 110 containing less metallic impurities and having a thickness equal to or less than about 1 nm is formed on the surface of the silicon substrate 10 between the two LOCOS portions 400, as shown in FIG. 7B.

Figure 7C:
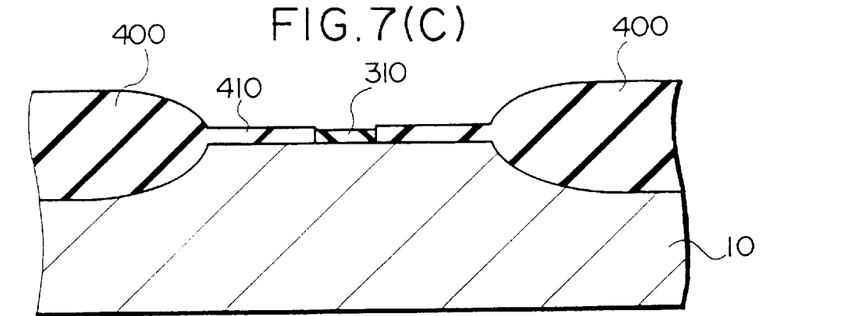

Thereafter, the silicon substrate 10 is thermally oxidized together with the native oxide film 110 to form a tunnel oxide film 310, as shown in FIG. 7C. For example, the film thickness is between about 8 nm and about 10 nm.

Figure 7D:
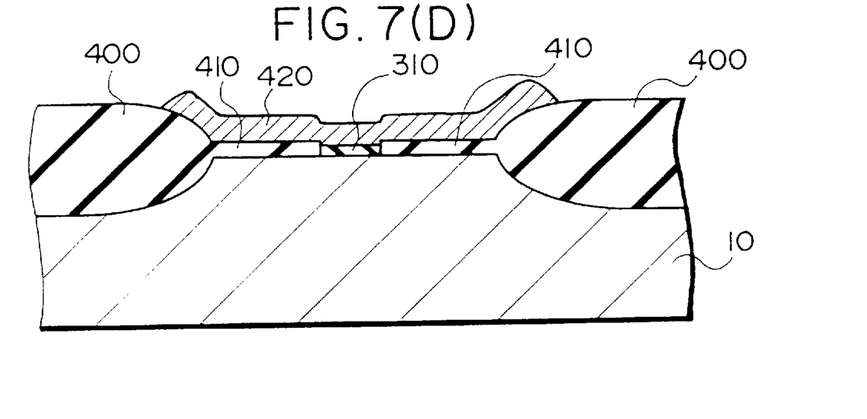

An electrode 420 of polysilicon, for example, is further formed, as shown in FIG. 7D.

Figure 8:
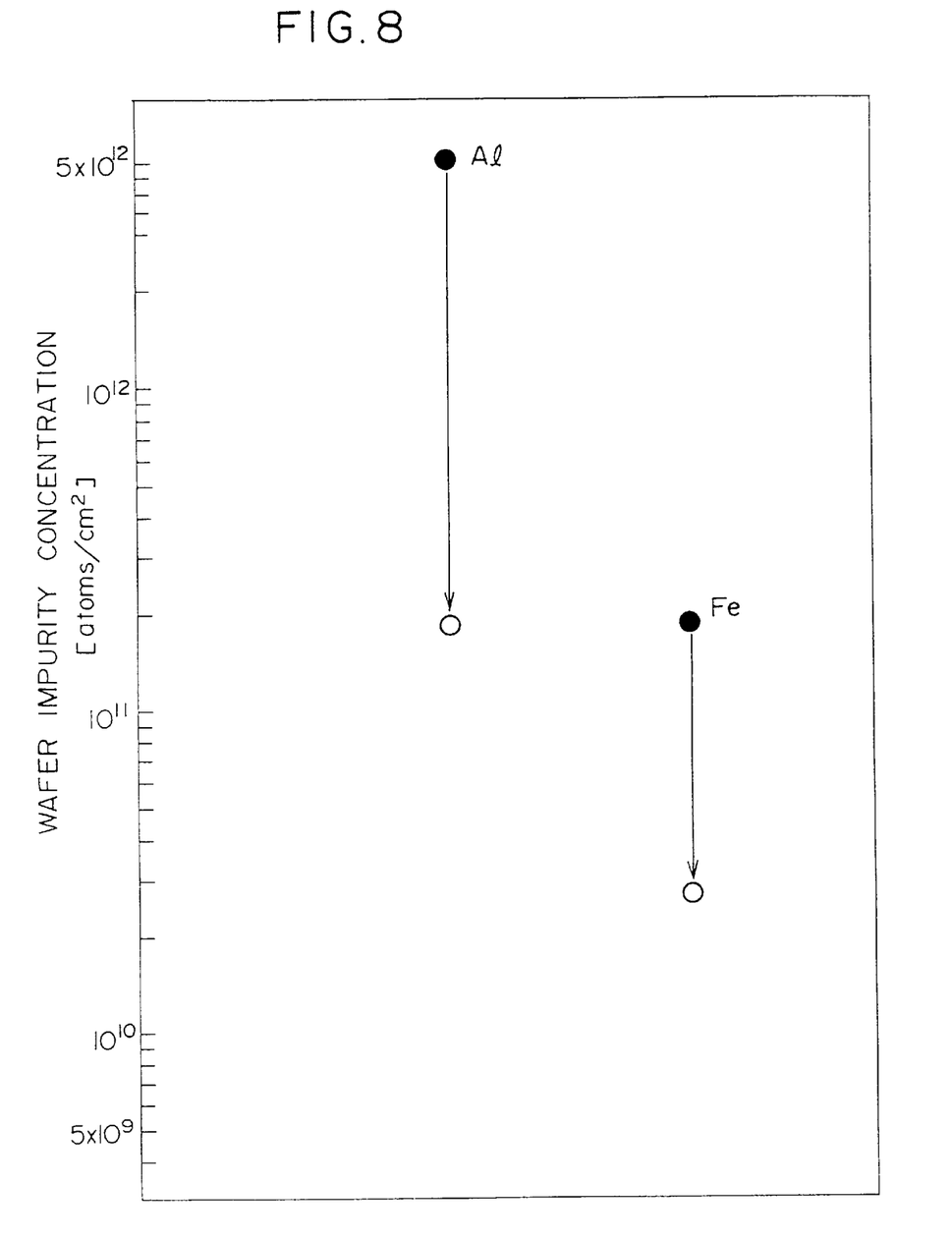
FIG. 8 is a graph illustrating reduction of the metallic impurity concentration which is accomplished by the cleaning steps of the present invention.

DEVICE CHARACTERISTICS ON USING CLEANING PROCESS OF THE PRESENT INVENTION (1) As to metallic impurities FIG. 8 is a graph illustrating the concentrations of metallic impurities on silicon substrates each including a native oxide film when the silicon substrates are cleaned according to this embodiment (white circles) and when the silicon substrates are cleaned only by the use of the prior art ammonia-hydrogen peroxide mixture cleaning solution (black circles). As will be apparent from FIG. 8, the concentration of iron (Fe) obtained by this embodiment, which is about $2\times10^{11}$ (atoms/cm$^2$), is about one-seventh of the iron concentration obtained by the prior art, which is about $3\times10^{10}$ (atoms/cm$^2$). Iron concentration depends on the concentration of metallic impurities in the first cleaning solution. According to this embodiment, the number of iron atoms (Fe) on the substrate including the native oxide film can be reduced to the order of $10^{10}$ (atoms/cm$^2$) or even less when a conventional first cleaning solution commercially available is used.

The concentration of aluminum (Al) obtained by this embodiment, which is about $5\times10^{12}$ (atoms/cm$^2$), is about ⅕ of the aluminum concentration obtained by the prior art, which is about $2\times10^{11}$ (atoms/cm$^2$). According to this embodiment, therefore, the number of aluminum atoms (Al) can be reduced to the order of $10^{11}$ (atoms/cm$^2$) or less even when the silicon substrate is cleaned by the use of the first cleaning solution having the above normal degree of contamination.

(2) Reliability of device

The inventors considered the insulation breakdown of a MOS capacitor having a device structure which is produced through the production process shown in FIGS. 5A–5D. The MOS device comprises an n-type silicon substrate 10, a gate oxide film 210 and a polysilicon electrode 220.

Figure 9:
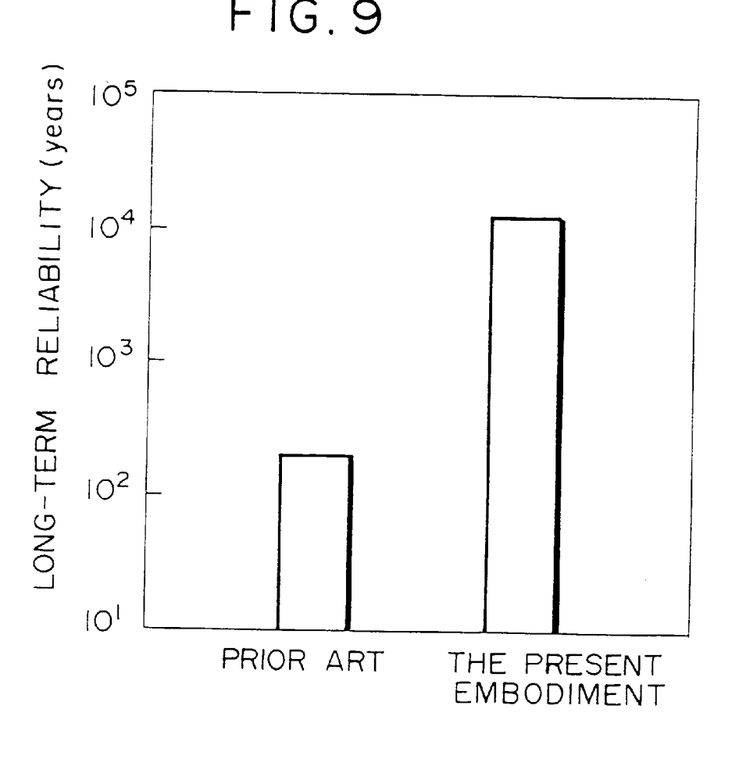
FIG. 9 is a graph illustrating a device which is improved in long-term reliability according to the cleaning steps of the present invention.

The long-term reliability of the device against the insulation breakdown of such a MOS capacitor was tested to make a comparison between the cleaning process according to this embodiment and the prior art process only using the ammonia-hydrogen peroxide mixture cleaning solution. The results are shown in FIG. 9.

In the prior art, the lifetime until the percent defective of breakdown becomes equal to 0.1% was $1.97\times10^2$ (years). In this embodiment, the lifetime was about $1.22\times10^4$ (years). This is about 100 times longer than the prior art.

Conditions wherein the long-term reliability was tested are as follows: The film thickness of the prior art gate oxide film was 9.8 nm while the film thickness of this embodiment was about 9.0 nm. Such a difference results from variability on film formation. The gate oxide films of the prior art and this embodiment are of the same area, 0.0406 cm$^2$. Measuring method was a constant-voltage time dependent dielectric breakdown (TDDB). In such a measuring method, a constant voltage was continuously applied to the gate oxide films with different field strength such that time required to create the insulation breakdown was accelerated. The lifetime in the gate oxide films under a certain condition was estimated from the relationship between the voltage application time and the cumulative percent defective.

Also in the floating gate type nonvolatile memory shown in FIGS. 7A–7D, the lifetime whereat the tunnel oxide film will be degraded due to passage of electrons can be prolonged since the contents of the metallic impurities in the tunnel oxide film are reduced.

(3) Number of particles

Figure 10:
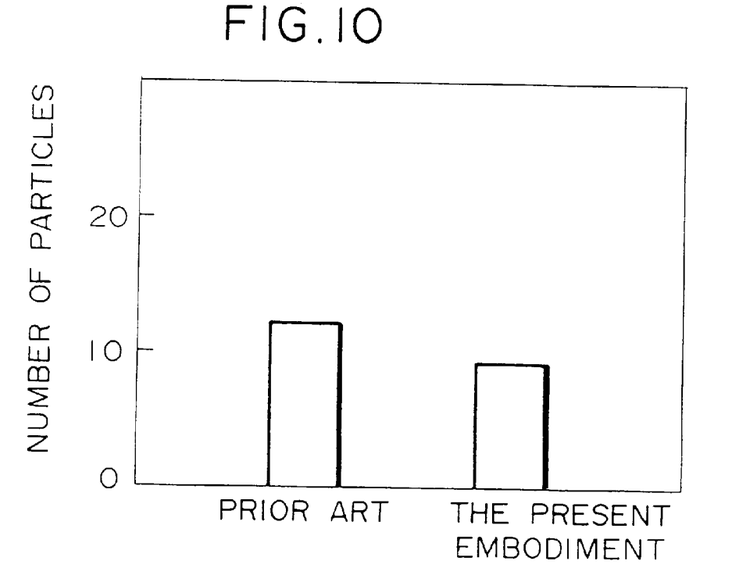
FIG. 10 is a graph illustrating the reduced number of particles which is accomplished by the cleaning steps of the present invention.

FIG. 10 is a graph illustrating the number of particles on the native oxide film, each particle having its diameter equal to or larger than 0.21 μm, to make a comparison between the cleaning process of this embodiment and the cleaning process of the conventional ammonia-hydrogen peroxide mixture cleaning solution. As will be apparent from FIG. 10, the number of particles was less when the cleaning process of this embodiment was carried out.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention.

What is claimed is:

1. A method of making a semiconductor device on a substrate having a silicon surface, comprising:
   (a) cleaning said substrate with a first cleaning solution and forming a native oxide film on said silicon surface, said substrate being wetted by said first cleaning solution;

(b) rinsing said substrate with a first rinsing solution;

(c) cleaning said substrate with a second cleaning solution and removing a surface layer of said native oxide film formed in step (a), said second cleaning solution including hydrogen fluoride, said substrate being wetted by said second cleaning solution; and (d) rinsing said substrate with a second rinsing solution, wherein a time T1 in minutes from a start of step (c) to a start of step (d) is defined as:

$$T1 < 6.35 \times 10^6 \times (\text{the hydrogen fluoride concentration of the second cleaning solution in ppm})^{-2.214},$$

and said native oxide being present on said substrate at the end of step (d).

2. The method of claim 1, wherein the concentration of hydrogen fluoride in said second cleaning solution is between about 60 ppm and about 2000 ppm.

3. The method of claim 2, wherein:

$$T2+T3+T4 < 6.35 \times 10^6 \times (\text{the hydrogen fluoride concentration of the second cleaning solution in ppm})^{-2.214},$$

where T2 is a cleaning time in minutes from the start of step (c) to an end of step (c); T3 is a conveyance time in minutes from the end of step (c) to a point during step (d) when said substrate is immersed in said second rinsing solution; and T4 is a margin time in minutes.

4. The method of claim 3, wherein the concentration of hydrogen fluoride in said second cleaning solution is between about 100 ppm and about 1200 ppm.

5. The method of claim 3, wherein the concentration of hydrogen fluoride in said second cleaning solution is between about 100 ppm and about 300 ppm.

6. The method of claim 5, wherein a sum of T2, T3 and T4 is between about 1 minute to about 20 minutes.

7. The method of claim 1, wherein said second cleaning solution contains one of ozone and hydrogen peroxide.

8. The method of claim 1, wherein said first cleaning solution contains one of hydrogen peroxide and ozone.

9. The method of claim 1, wherein a film thickness of said native oxide film left on said substrate at a start of step (d) is at most about 1 nm.

10. The method of claim 1, further comprising the steps of:

(e) drying said substrate after termination of step (d); and (f) forming an oxide film on said substrate having said native oxide film thereon.

11. The method of claim 10, wherein an iron concentration on said substrate after step (e) is at most about in the order of $10^{10}$ atoms/cm$^2$.

12. The method of claim 10, wherein an aluminum concentration on said substrate after step (e) is at most about in the order of $10^{11}$ atoms/cm$^2$.

13. The method of claim 10, wherein said oxide film is a transistor gate oxide film formed over said substrate having said native oxide film thereon.

14. The method of claim 10, wherein said oxide film is a memory capacitor oxide film formed over said substrate having said native oxide film thereon.

15. The method of claim 10, wherein said oxide film is a tunnel oxide film for floating gate type nonvolatile memory formed over said substrate having said native oxide film thereon.

16. A method of making a semiconductor device on a substrate having a silicon surface, comprising:

(a) cleaning said substrate with a first cleaning solution and forming a native oxide film on said silicon surface;

(b) rinsing said substrate wetted with the first cleaning solution with a first rinsing solution;

(c) cleaning said substrate with a second cleaning solution so as to remove only a surface portion of said native oxide film formed in step (a), said second cleaning solution including hydrogen fluoride in a concentration of less than about 2000 ppm; and (d) rinsing said substrate having said native oxide film thereon with a second rinsing solution such that said native oxide film is maintained on said substrate at an end of step (d).

17. The method of claim 16, wherein a time T1 in minutes from a start of step (c) to a start of step (d) is defined as:

$$T1 < 6.35 \times 10^6 \times (\text{the concentration of said hydrogen fluoride in said second cleaning solution in ppm})^{-2.214}.$$

18. A method of cleaning a substrate having a silicon surface, comprising:

(a) cleaning said substrate with a first cleaning solution and forming a native oxide film on said silicon surface;

(b) rinsing said substrate wetted with the first cleaning solution with a first rinsing solution;

(c) cleaning said substrate with a second cleaning solution so as to remove only a surface portion of said native oxide film formed in step (a), said second cleaning solution including hydrogen fluoride in a concentration of less than about 2000 ppm; and (d) rinsing said substrate having said native oxide film thereon with a second rinsing solution within an effective amount of time from a start of step (c) based on the hydrogen fluoride concentration in the second cleaning solution to maintain said native oxide film on said substrate at an end of step (d) wherein said silicon surface is hydrophilic.

* * * * *

UNITED STATES PATENT AND TRADEMARK OFFICE
CERTIFICATE OF CORRECTION

PATENT NO. : 5,904,574
DATED : May 18, 1999
INVENTOR(S) : Tatsumi NISHIJIMA

It is certified that error appears in the above-indentified patent and that said Letters Patent is hereby corrected as shown below:

On the title page, item: [30], below the priority information beginning with "Aug. 10, 1995"; insert the following additional priority information:

--Jun. 18, 1996   [JP] Japan ................8-177504--.

Signed and Sealed this

Ninth Day of November, 1999

Attest:

Q. TODD DICKINSON

Attesting Officer

Acting Commissioner of Patents and Trademarks